United States Patent
Koenig

(10) Patent No.: US 8,415,773 B2
(45) Date of Patent: Apr. 9, 2013

(54) SEMICONDUCTOR COMPONENT WITH BUFFER LAYER

(75) Inventor: Bernhard Koenig, Fürth (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 215 days.

(21) Appl. No.: 12/214,641

(22) Filed: Jun. 20, 2008

(65) Prior Publication Data

US 2009/0032912 A1 Feb. 5, 2009

(30) Foreign Application Priority Data

Jun. 20, 2007 (DE) .......................... 10 2007 028 316

(51) Int. Cl.
*H01L 29/167* (2006.01)
*H01L 29/207* (2006.01)
*H01L 29/227* (2006.01)

(52) U.S. Cl.
USPC .................... 257/655; 257/656; 257/E29.327

(58) Field of Classification Search .......... 257/655–657, 257/109, 328, E29.327, E29.328, E29.332, 257/E29.336
See application file for complete search history.

(56) References Cited

U.S. PATENT DOCUMENTS

| | | | | |
|---|---|---|---|---|
| 6,060,745 | A * | 5/2000 | Tadokoro et al. | 257/329 |
| 6,791,121 | B2 * | 9/2004 | Nemoto et al. | 257/109 |
| 7,358,127 | B2 * | 4/2008 | Nemoto | 438/197 |
| 7,361,970 | B2 * | 4/2008 | Barthelmess et al. | 257/607 |
| 2004/0041225 | A1 * | 3/2004 | Nemoto | 257/458 |
| 2007/0108558 | A1 | 5/2007 | Nemoto | |

FOREIGN PATENT DOCUMENTS

| | | |
|---|---|---|
| EP | 1 096 576 | 5/2001 |
| JP | 2000223720 | 8/2000 |

OTHER PUBLICATIONS

Nemoto M et al. "MBBL diode: a novel soft 1-7 recovery diode" Power Semiconductor Devices and ICS, 2004. Proceedings. ISPSD '04 the 16$^{th}$ International Symposium on Kitakyushu Int. Conf. Ctr, Japan May 24-27, 2004, Piscataway, NJ, USA IEEE, May 24, 2004 pp. 433-436 XP010723442.

Rahimo M. T. et al. "A review on fast power 1-7 diode development and modern novel structures" 19960621, Jun. 21, 1996 pp. 2/1-2/12, XP006510930.

* cited by examiner

*Primary Examiner* — Shouxiang Hu
(74) *Attorney, Agent, or Firm* — The Law Offices of Roger S. Thompson

(57) ABSTRACT

A semiconductor component having at least one pn junction and an associated production method. The semiconductor component has a layer sequence of a first zone having a first dopant. The first zone faces a first main area. Adjacent to the first zone are a second zone having a low concentration of a second dopant, a subsequent buffer layer, the third zone, also having the second dopant and a subsequent fourth zone having a high concentration of the second dopant. The fourth zone faces a second main area. In this case, the concentration of the second doping of the buffer layer is higher at the first interface of the barrier layer with the second zone than at the second interface with the fourth zone. According to the invention, the buffer layer is produced by ion implantation.

7 Claims, 3 Drawing Sheets

SEMICONDUCTOR COMPONENT WITH BUFFER LAYER

BACKGROUND OF THE INVENTION

1. Field of the Invention

The invention is directed to a semiconductor component having at least one pn junction, preferably a diode for applications in the power class. Diodes of this type are employed by way of example in combination with power switches, especially power transistors, as so-called freewheeling diodes.

2. Description of the Related Art

A known method of manufacturing semiconductor devices, including diodes, is described in European Patent No. EP 1 096 576 A1, which describes forming diodes in a layer sequence with a first zone having a first dopant and further zones having a second dopant. In this case, doping is understood to mean the arrangement of dopant atoms, of donors or acceptors, in a unit of volume; consequently, a concentration of dopant atoms per unit volume is defined therein. In this case, in accordance with the prior art, in the further zones the concentration of the second dopant increases continuously or discontinuously proceeding from the first zone. It is known that, in individual zones, among said further zones, the concentration of the doping may be constant; likewise, the concentration of the doping in one or more zones, can increase in a manner obeying an exponential function. What is essential, however, is that the concentration of the doping has a basic profile in accordance with FIG. 4 hereof.

FIG. 4 shows by way of example the concentration profile of the doping of a power diode according to the prior art. Here the illustration shows a first main area, (H1), to which a first, here a p-doped, zone (10) is adjacent. This is followed by an $n^-$-doped second zone (20), which preferably has the constant basic concentration of the doping of the base material, here of a silicon wafer. Adjacent to second zone (20) is a first interface (G1) and a third, n-doped zone (30), which acts as a buffer layer. As last, a fourth zone (40) of the layer sequence there follows from an interface (G2) with an $n^+$-doped zone and subsequently the second main area (H2) of the semiconductor component. Required metallizations of main areas (H1, H2) for contact purposes are not described any further here.

In accordance with the prior art, third zone (30) and fourth zone (40) have been produced by diffusion from the direction of second main area (H2). This also results in the profile of said dopings that is typical of diffusion methods. In accordance with the prior art, the p-type doping of first zone (10) is effected by means of diffusion methods from the direction of first main area (H1).

As mentioned above, power diodes of this type are employed as freewheeling diodes in antiparallel connection with power transistors. FIG. 5 shows the current and voltage profile across the diode in the case of switching on an antiparallel-connected power transistor, the diode being converted from the on state to the off state. In this case, the voltage ($U_i$) drop across the diode ideally rises to approximately the value of the voltage source. At the same time, the current ($I_i$) through the diode falls to zero. In the further course of the profile, the current flow becomes negative, or changes its direction, since here the pn junction is depleted of charge carriers. The current furthermore decreases to the reverse current of the diode.

In real operation, the current profile ($I_R$) and voltage profile ($U_R$) differ from the ideal due to parasitic inductances and a non-ideal component characteristic of the diode and the power transistor. As a result of a fast temporal change in the current after the reverse current peak ($I_S$), overvoltages and resultant oscillations are induced in the real voltage profile ($U_R$) and therefore also in the real current profile ($I_R$). In this case, the physical effect is the fast field propagation of the electrical field in the diode. As a result of this, the positive and negative charge carriers are removed very rapidly, whereby current chopping takes place. Known buffer layers (30, cf. FIG. 4) here form a reserve of charge carriers in order to reduce the rate of removal and hence to slow down the current chopping.

The aforementioned oscillations (S1, S2) on the one hand limit the maximum possible switching speed of an arrangement comprising the diode and power transistor, which means a restriction of the functionality of power converters constructed therefrom. On the other hand, excessively high amplitudes of the oscillations (S1, S2) can destroy the diode itself. Therefore, there is a need in the art for a power diode that exhibits minimum oscillation and a small oscillation amplitude (S1, S2).

OBJECT AND SUMMARY OF THE INVENTION

Consequently, it is the object of the invention to provide a semiconductor component having at least one pn junction and a buffer layer having improved switching properties.

The starting point of the invention is a semiconductor component having at least one change from a first to a second doping, viz., a pn junction. This semiconductor component therefore has a layer sequence of a first zone or region having a first doping, with the first zone facing a first main area, and a subsequent region having a second doping. This region having a second doping, for its part, is formed by at least three zones having different concentrations of the doping. The first zone having the first doping is followed directly by a second zone having a low concentration of a second doping. Adjacent to this is a buffer layer, the third zone, likewise having the second doping. The termination is formed by a fourth zone having a high concentration of the second doping, with the fourth zone facing a second main area of the component.

According to the invention, the buffer layer is formed so that the concentration of the second doping of the buffer layer is higher at the first interface of the buffer layer with the second zone than at the second interface with the fourth zone. As a result of the buffer layer being formed in this way, since the propagation of the electric field is impeded in the region of high concentration, a reserve of charge carriers is present in the region of low concentration.

It is particularly preferred if the first zone is p-doped, the second zone is $n^-$-doped, the fourth zone is $n^+$-doped and the third zone has a maximum concentration of an n-type doping which is greater than the maximum concentration of the second zone and less than the maximum concentration of the fourth zone.

It may be preferred for the buffer layer, the third zone, to be produced by ion implantation. This method according to the invention then leads to a pulsating decrease in the concentration of the doping from the first interface of the buffer layer to the second interface of the buffer layer. By means of the ion implantation, in this case doping atoms are introduced in stepped fashion in different depths and with increasing depth, preferably from the first main area, with decreasing concentration. This results in the pulsating decrease in the doping concentration within the buffer layer.

Particularly preferred developments of this semiconductor component, and of the method of making such a component are mentioned in the respective description of the exemplary embodiments. The inventive solution is additionally explained further on the basis of the exemplary embodiments illustrated in FIGS. 1 to 3.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
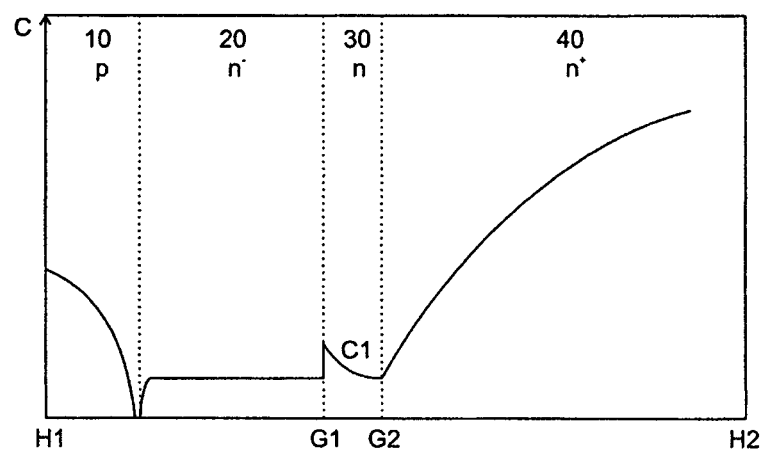
FIG. 1 shows a doping profile of a first semiconductor component according to the invention, here a power diode.

FIG. 1 shows a doping profile of a first semiconductor component according to the invention, here a power diode. The illustration shows two main areas (H1, H2) of the diode, wherein the illustration of a contact metallization possibly required on said main areas (H1, H2) has been omitted for clarity.

Figure 4:
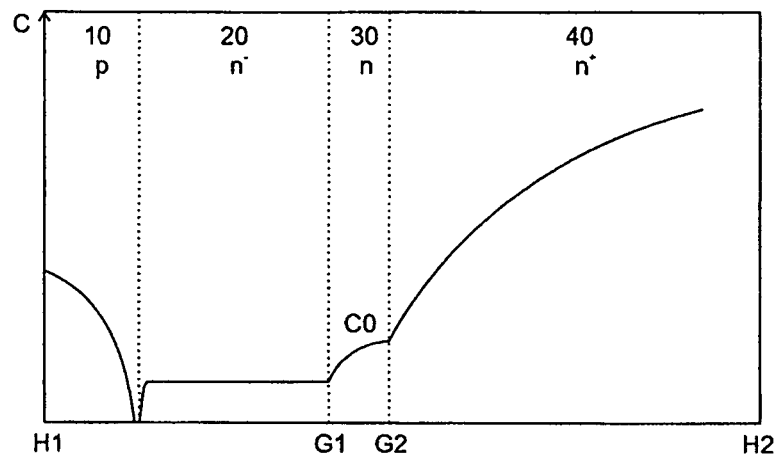
FIG. 4 shows a doping profile of a prior art semiconductor component.
Figure 6:
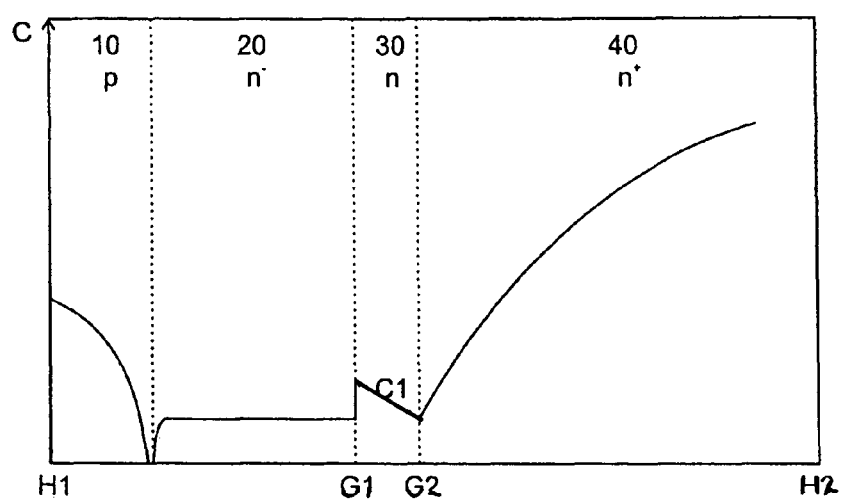
FIG. 6 shows a doping profile of a third semiconductor component according to the invention.

Adjacent to the first main area (H1) is a p-doped first zone (10), the doping concentration of which decreases from about $10^{20}$ to about $10^{13}$. A second zone (20) has a homogeneous n-type doping having a concentration in the range of from about $10^{13}$ to about $10^{15}$. This concentration preferably corresponds to the basic doping of the wafer. The change to the second zone forms the pn junction of the diode. According to the invention, second zone (20) is followed by a third zone (30), the so-called buffer layer, having a doping whose concentration (C1) decreases generally continuously in the direction of second main area (H2), in contrast to the prior art (cf. C0 in FIG. 4). At the interface, (G1) with second zone (20), the doping has a concentration of from about $10^{13}$ to about $10^{17}$, for example. According to the invention, this value decreases towards the end of buffer layer (30), here to the value of the basic doping. This decrease in the concentration (C1) can be fashioned linearly or exponentially, a linear decrease being preferred in this case as shown in FIG. 6.

The buffer layer (30) is followed by a fourth, here the last, zone (40) having the second doping, wherein the concentration thereof exponentially increases greatly from the basic doping to a value of the order of magnitude of $10^{20}$.

Figure 2:
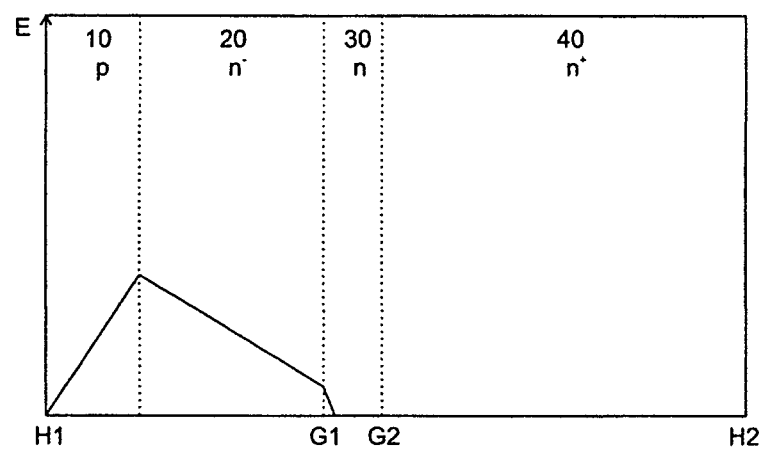
FIG. 2 shows the profile of the electric field while the reverse current through a power diode, manufactured in accordance with FIG. 1, decreases.
Figure 5:
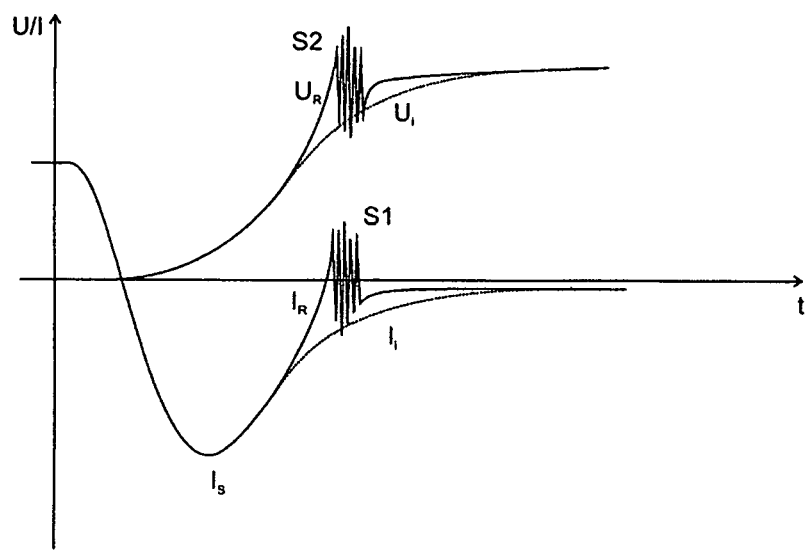
FIG. 5 shows the profile of the electric field while the reverse current through the prior art component of FIG. 4 decreases.

FIG. 2 shows the profile of the electric field while the reverse current through a power diode in accordance with FIG. 1 decreases; this is given by way of example at the instant (T1, cf. FIG. 5). The field profile in the first (10) and second (20) zones corresponds to the prior art until near buffer layer (30). The formation of buffer layer (30) according to the invention prevents the propagation of the electric field from second zone (20) to fourth zone (40). A certain reserve of positive charge carriers arises. This minimizes or prevents the chopping of the reverse current and hence the formation of oscillations (S1, S2; cf. FIG. 5).

Figure 3:
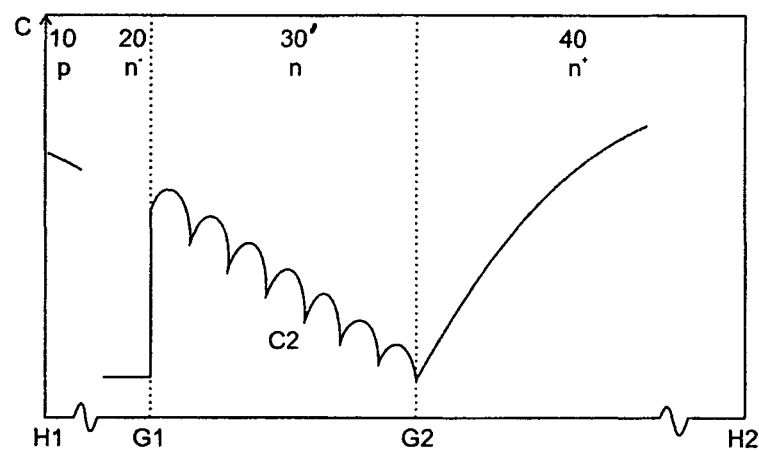
FIG. 3 shows a doping profile of a second semiconductor component according to the invention.

FIG. 3 shows a doping profile of a second semiconductor component according to the invention. In this case, the first (10), second (20) and fourth (40) zones are formed analogously to that semiconductor component described with regard to FIG. 1.

According to the invention, buffer layer (30') has a higher doping concentration at its first interface (G1) with the second zone (20) than at its second interface (G2) with the fourth zone (40). The concentration (C2) does not decrease linearly but rather in a pulsating manner from said first (G1) to the second (G2) interface. It is preferred that between two and ten pulses are used. Seven pulses are illustrated in FIG. 3 for illustration, and not as an implication that seven is preferred. The precise number of pulses is a matter of design choice and the selection of the precise number of pulses is within the ability of one of ordinary skill in the art without undue experimentation. This profile arises as a result of the production process in accordance with the method according to the invention.

In this case, the buffer layer (30') is doped by means of ion implantation from the direction of the first main area (H1). Doping atoms are introduced in a defined depth of the wafer by means of each implantation step. The depth distribution of the doping atoms is characterized by a distribution function in physically governed fashion.

The characteristic pulsating profile (C2) is produced by a plurality of these implantation steps with a different penetration depth. By reducing the number of implanted doping atoms, the concentration decreases in a pulsating manner as illustrated from the first interface (G1) to the second interface (G2) of the buffer layer (30).

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

I claim:

1. A semiconductor component comprising:
    a first region having a first zone doped with a first dopant selected from the group consisting of one of donors and acceptors;
    a second region doped with a second dopant of the other of donors and acceptors;
    a pn junction between said first region and said second region;
    wherein said second region includes a second zone having a low concentration of said second dopant, said second zone being disposed adjacent to said first zone, the boundary between said first and second zones forming said pn junction;

a third zone having a concentration of said second dopant, and constituting buffer means for buffering the propagation of an electric field therethrough;

a first interface between said second zone and said third zone;

a fourth zone having a high concentration of said second dopant; and a second interface between said third zone and said fourth zone;

wherein said concentration of said second dopant in said third zone is higher at said first interface than it is at said second interface.

2. The semiconductor component of claim 1, wherein said first dopant is a p-dopant, and said second dopant is an n-dopant;

wherein said second zone is n$^-$-doped;

wherein said fourth zone is n$^+$-doped; and wherein said third zone has a concentration of said n-dopant which is greater than the maximum concentration of said second dopant in said second zone and less than the maximum concentration of said second dopant in said fourth zone.

3. The semiconductor component of claim 2, wherein the maximum concentration of said n-dopant in said n$^-$-doped second zone is from about $10^{13}$ to about $10^{15}$;

wherein the maximum concentration of said n-dopant in said n-doped third zone is about $10^{17}$; and wherein the maximum concentration of said n-dopant in said n$^+$-doped fourth zone is on the order of magnitude of $10^{20}$.

4. The semiconductor component of claim 1, wherein the concentration of dopant in said third zone falls exponentially from said first interface to said second interface.

5. The semiconductor component of claim 1, wherein the concentration of dopant in said third zone falls linearly from said first interface to said second interface.

6. The semiconductor component of claim 1, wherein the concentration of dopant in said third zone falls in a pulsating manner from said first interface to said second interface.

7. A semiconductor component comprising:

a first region having a first zone doped with a first dopant selected from the group consisting of one of donors and acceptors;

a second region doped with a second dopant of the other of donors and acceptors;

a pn junction between said first region and said second region;

wherein said second region includes a second zone having a low concentration of said second dopant, said second zone being disposed adjacent to said first zone, the boundary between said first and second zones forming said pn junction;

a third zone having a concentration of said second dopant, and constituting buffer means for buffering the propagation of an electric field therethrough;

a first interface between said second zone and said third zone;

a fourth zone having a high concentration of said second dopant; and a second interface between said third zone and said fourth zone;

wherein said concentration of said second dopant in said third zone is higher at said first interface than it is at said second interface; and wherein said concentration of said second dopant in said third zone at said first interface is discontinuously higher than said concentration of said second dopant in said second zone at said first interface.

* * * * *